United States Patent
Floyd et al.

(10) Patent No.: US 10,635,734 B2
(45) Date of Patent: Apr. 28, 2020

(54) SYSTEM AND METHOD FOR UTILIZING A THREE DIMENSIONAL MODEL FOR ACCESSING DATABASES

(71) Applicant: THE BOEING COMPANY, Huntington Beach, CA (US)

(72) Inventors: Joseph Frank Floyd, University Place, WA (US); Brent Louis Hadley, Kent, WA (US); Patrick Jan Eames, Newcastle, WA (US); Darren Brian Macer, Seattle, WA (US)

(73) Assignee: The Boeing Company, Chicago, IL (US)

( * ) Notice: Subject to any disclaimer, the term of this patent is extended or adjusted under 35 U.S.C. 154(b) by 1443 days.

(21) Appl. No.: 14/574,646

(22) Filed: Dec. 18, 2014

(65) Prior Publication Data

US 2015/0100571 A1  Apr. 9, 2015

Related U.S. Application Data

(63) Continuation-in-part of application No. 12/577,710, filed on Oct. 12, 2009.

(51) Int. Cl.
*G06F 16/9537* (2019.01)
*G06F 17/50* (2006.01)
*G06Q 10/06* (2012.01)

(52) U.S. Cl.
CPC ...... *G06F 16/9537* (2019.01); *G06F 17/5095* (2013.01); *G06Q 10/06313* (2013.01)

(58) Field of Classification Search
USPC .............................................. 705/7.11–7.42
See application file for complete search history.

(56) References Cited

U.S. PATENT DOCUMENTS

| | | | |
|---|---|---|---|
| 4,928,233 A | 5/1990 | Millis | |
| 5,742,331 A | 4/1998 | Uomori et al. | |
| 5,966,132 A | 10/1999 | Kakizawa et al. | |
| 6,241,610 B1 | 6/2001 | Miyamoto et al. | |
| 6,944,584 B1 | 9/2005 | Tenney et al. | |
| 7,069,261 B2 | 6/2006 | Ahl et al. | |
| 7,440,906 B1 | 10/2008 | Wetzer et al. | |
| 7,506,547 B2 | 3/2009 | Jesmonth | |
| 8,683,367 B1 | 3/2014 | Hadley et al. | |

(Continued)

OTHER PUBLICATIONS

Brown, R.; Driving Digital Manufacturing to Reality; Proceeding of the 2000 Winter Simulation Conference; 2000; pp. 224-228.
Brown, R. et al.; The Factory is Virtual . . . The Savings are Real; RTO AVT Symposium on Reduction of Military Vehicle Acquisition Time and Cost through Advanced Modelling and Virtual Simulation; Paris, France; Apr. 22-25, 2002; pp. 6-1 to 6-8.

(Continued)

*Primary Examiner* — Amber A Misiaszek
(74) *Attorney, Agent, or Firm* — Armstrong Teasdale LLP

(57) ABSTRACT

A database access computing device for utilizing a three dimensional model to access databases for information regarding one or more parts in a vehicle is provided. The database access computing device includes at least one processor. The database access computing device is configured to display a three dimensional model representing at least one version of a vehicle, receive a selection of a location within the three dimensional model, identify at least one part number associated with the location in a first database, retrieve part information from at least a second database using the part number, and display the part information retrieved from at least the second database on the three dimensional model.

17 Claims, 11 Drawing Sheets

(56) References Cited

U.S. PATENT DOCUMENTS

| | | |
|---|---|---|
| 8,843,350 B2 | 9/2014 | Jacobi et al. |
| 2002/0059320 A1 | 5/2002 | Tamaru |
| 2002/0120921 A1 | 8/2002 | Coburn |
| 2002/0133252 A1 | 9/2002 | Landers et al. |
| 2003/0004600 A1 | 1/2003 | Priedeman, Jr. |
| 2003/0182083 A1 | 9/2003 | Schwenke et al. |
| 2003/0187823 A1 | 10/2003 | Ahl et al. |
| 2004/0117081 A1 | 6/2004 | Mori |
| 2004/0128120 A1 | 7/2004 | Coburn et al. |
| 2004/0254764 A1 | 12/2004 | Wetzer et al. |
| 2006/0268018 A1 | 11/2006 | Christman et al. |
| 2006/0287084 A1 | 12/2006 | Mao et al. |
| 2007/0070066 A1 | 3/2007 | Bakhash |
| 2007/0112488 A1 | 5/2007 | Avery et al. |
| 2007/0241908 A1* | 10/2007 | Coop ............ G06Q 10/06 340/572.8 |
| 2007/0294278 A1* | 12/2007 | Vandermolen ...... G06Q 10/06 |
| 2009/0138139 A1 | 5/2009 | Tsai et al. |
| 2010/0211358 A1* | 8/2010 | Kesler ............ G07C 9/00111 702/184 |
| 2011/0087513 A1 | 4/2011 | Floyd et al. |
| 2014/0249779 A1 | 9/2014 | Cheung et al. |

OTHER PUBLICATIONS

Haber, J.; 787 Maintenance Training—A New World-Class Training Standard; Boeing; Sep. 21, 2006; pp. 1-30.

Douglas, R.; Maintenance Performance Toolbox; Boeing.com Commercial Aerospace Magazine Aerospace Quarterly; Qtr 1; 2007; pp. 22-27.

Nader, A. et al; 787 Training for Pilots and Mechanics; Boeing.com Commercial Aerospace Magazine Aerospace Quarterly; Qtr 1; 2008; pp. 6-15.

Asia Pacific, Japan Airlines: To Enter Innovative Maintenance Deal with Boeing, Troubled Company Reporter, dated Oct. 10, 2005, pp. 3.

AviationWeek, "Caribbean Airlines selected Modules", dated Apr. 1, 2007, pp. 14.

3rd Dimension, Rolling Stone and 3D, Veritas et Visus, dated Mar. 2006, vol. 1, No. 8, pp. 36.

Cortona 3D, Cortona3D RapidTag Powers Boeing's New Maintenance Performance Toolbox, dated Mar. 14, 2006, pp. 2.

EPO Extended European Search Report for related application 15189236.1 dated May 4, 2016; 7 pp.

\* cited by examiner

This is a continuation in part of U.S. patent application Ser. No. 12/577,710, filed Oct. 12, 2009, which is hereby incorporated by reference in its entirety.

SYSTEM AND METHOD FOR UTILIZING A THREE DIMENSIONAL MODEL FOR ACCESSING DATABASES

CROSS REFERENCE TO RELATED APPLICATIONS

This is a continuation in part of U.S. patent application Ser. No. 12/577,710, filed Oct. 12, 2009, which is hereby incorporated by reference in its entirety.

BACKGROUND

The present disclosure relates generally to retrieving and storing information pertaining to parts in a vehicle, such as an aircraft, and more specifically to retrieving and storing data based on locations of aircraft parts in one or more three dimensional models.

Aircraft are modeled and designed using three dimensional ("3D") computer aided design ("CAD") software. As a result, virtually every part of the aircraft is defined in 3D, including structure, mechanical systems, electrical systems, and propulsion systems. Within a 3D CAD database, each part may have various attributes associated with it, such as geometry information (e.g., centroid coordinates, shape, and volume), weight information, and vendor information. Many 3D CAD database systems enable a user to use 3D navigation to find data stored within the CAD database that is associated with a part or parts. However, it is not always convenient to store all information associated with aircraft parts in a 3D CAD database or in a format that indexes information in association with 3D locations within an aircraft. Accordingly, aircraft manufacturers (OEM) and/or airlines who own and/or operate aircraft may use multiple database systems that have different formats and that are indexed in different manners to store and deliver information about aircraft parts (e.g., manufacturing data, aircraft maintenance data, aircraft repair data, and/or spare parts data). As a result, aircraft part information stored in one database, such as a maintenance database, may not be accessible to a user using a system interface designed for use with another database, such as a 3D CAD database.

SUMMARY OF THE INVENTION

In one aspect, a database access computing device for utilizing a three dimensional model to access databases for information regarding one or more parts in a vehicle is provided. The database access computing device includes at least one processor. The database access computing device is configured to display a three dimensional model representing at least one version of a vehicle, receive a selection of a location within the three dimensional model, identify at least one part number associated with the location in a first database, retrieve part information from at least a second database using the part number, and display the part information retrieved from at least the second database on the three dimensional model.

In another aspect, a method for displaying information regarding one or more parts in a product is provided. The method includes displaying, by a database access computing device, a three dimensional model representing at least one version of a product. The method also includes selecting a location within the three dimensional model, identifying, by the database access computing device, at least one part number associated with the location in a first database, retrieving, by the database access computing device, part information from at least a second database using the part number, displaying, by the database access computing device, the part information retrieved from at least the second database, and determining a task to be performed based on the part information.

In another aspect, a computer-readable storage device having computer-executable instructions embodied thereon is provided. When executed by a computing device including at least one processor, the computer-executable instructions cause the computing device to display a three dimensional model representing at least one version of an aircraft, receive a selection of a location within the three dimensional model, identify at least one part number associated with the location in a first database, retrieve part information from at least a second database using the part number, and display the part information retrieved from at least the second database on the three dimensional model.

DETAILED DESCRIPTION

Figure 1:
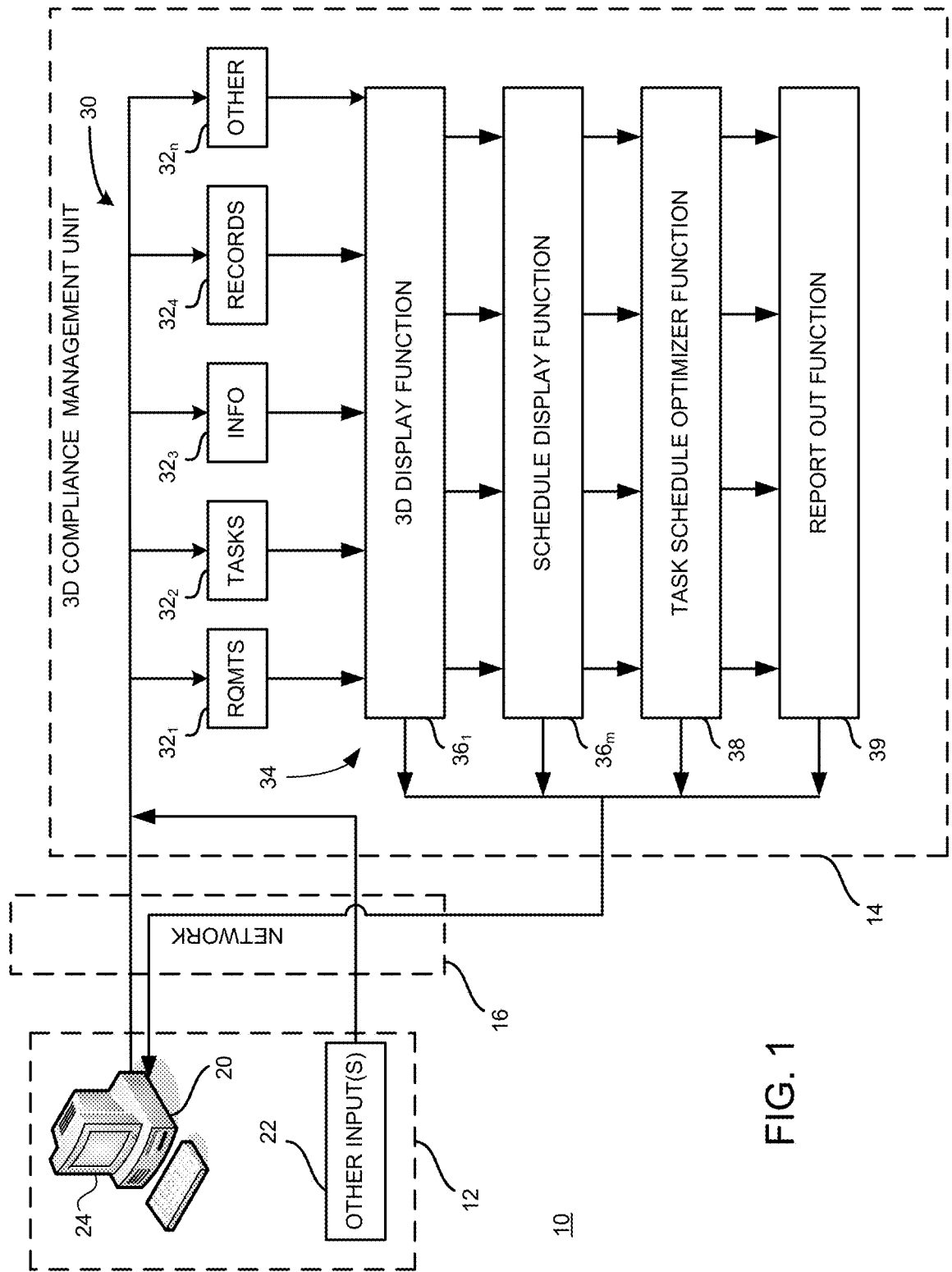
FIG. 1 illustrates a functional depiction of an example system for managing a program relating to a product containing a plurality of parts.

In addition to the aspects described above, a method for managing a program relating to a product containing one or more parts is provided. The program includes a plurality of program requirements for performing a plurality of program tasks relating to one or more parts. The method includes: (a) establishing a location reference system for a representation of the product in three dimensions; (b) identifying a plurality of task-loci in a display; the display presenting the representation of the product according to the location reference system; each respective task-locus of the plurality of task-loci being associated with a respective program task of the plurality of program tasks; (c) characterizing each respective task-locus associated with an accomplished respective program task as a respective completed task-locus; and (d) accounting for accomplishment of the respective program tasks by accounting for the respective completed task-loci.

In some implementations, the product is a vehicle. In some implementations, the vehicle is an aircraft.

Additionally, a system for managing a program relating to a product containing one or more parts is provided. The program includes a plurality of program requirements for performing a plurality of program tasks. The system includes: (a) a display unit presenting a plurality of task-loci in association with a representation of the product according to a location reference arrangement in three dimensions; each respective task-locus of the plurality of task-loci being associated with a respective program task of the plurality of program tasks; (b) a control apparatus coupled with the display apparatus and cooperating with the display apparatus to characterize each respective task-locus associated with an accomplished respective program task as a respective completed task-locus; and (c) a data reporting unit coupled with at least one of the control unit and the display unit; the data reporting unit accounting for accomplishment of the respective program tasks by accounting for the respective completed task-loci. In some implementations, the product is a vehicle. In some implementations, the vehicle is an aircraft.

It is, therefore, a feature of the present disclosure to provide a method and system for managing a program relating to a product that may provide a global view of the exact 3D physical locations on the airplane where all maintenance requirements or tasks apply.

It is also a feature of the present disclosure to provide a method and system for managing a program relating to a product that may provide a global view of the precise schedule for timely implementation of maintenance requirements or tasks.

Additionally, the present disclosure provides a database access computing device for utilizing a three dimensional model to access databases, a method for utilizing a three dimensional model to access databases, and a computer-readable storage device having computer-executable instructions embodied thereon for utilizing a three dimensional model to access databases.

Further features of the present disclosure will be apparent from the following specification and claims when considered in connection with the accompanying drawings, in which like elements are labeled using like reference numerals in the various figures, illustrating the preferred embodiments of the disclosure.

In one implementation, a computer program is provided, and the program is embodied on a computer-readable medium. In an example implementation, the computer program is executed on a single computing device, without requiring a connection to a server computer. The computer program is flexible and designed to run in various different environments without compromising any major functionality. In some implementations, the system includes multiple components distributed among a plurality of computing devices. One or more components may be in the form of computer-executable instructions embodied in a computer-readable medium. The systems and processes are not limited to the specific implementations described herein. In addition, components of each system and each process can be practiced independent and separate from other components and processes described herein. Each component and process can also be used in combination with other assembly packages and processes.

As used herein, an element or step recited in the singular and preceded with the word "a" or "an" should be understood as not excluding plural elements or steps, unless such exclusion is explicitly recited. Furthermore, references to "example implementation" or "one implementation" of the present disclosure are not intended to be interpreted as excluding the existence of additional implementations that also incorporate the recited features.

The terms "coupled" and "connected", along with their derivatives, may be used herein. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, or that the two or more elements co-operate or interact with each other (e.g. as in a cause and effect relationship).

The term "locus" is intended herein to indicate a place, location, locality, locale, point, position, site, spot, volume, juncture, junction or other identifiable location-related zone in one or more dimensions. A locus in a physical apparatus may include, by way of example and not by way of limitation, a corner, intersection, curve, line, area, plane, volume or a portion of any of those features. A locus in an electrical apparatus may include, by way of example and not by way of limitation, a terminal, wire, circuit, circuit trace, circuit board, wiring board, pin, connector, component, collection of components, sub-component or other identifiable location-related area in one or more dimensions. A locus in a flow chart may include, by way of example and not by way of limitation, a juncture, step, site, function, query, response or other aspect, step, increment or an interstice between junctures, steps, sites, functions, queries, responses or other aspects of the flow or method represented by the chart.

At least some systems and methods described herein may be employed in connection with any ongoing program relating to a product in which tasks associated with practicing the program may be performed according to a time schedule. In some implementations, the program is a maintenance program for aircraft.

FIG. 1 illustrates a functional depiction of an example system for managing a program relating to a product. In FIG. 1, a system 10 includes a control apparatus 12 and a 3D compliance management unit 14 communicatingly coupled by a network 16.

Control apparatus 12 may include a computer work station input unit 20 and other inputs 22. Input unit 20 may include a display unit 24. Network 16 may be embodied, by way of example and not by way of limitation, in the Internet or another communication network.

3D compliance management unit 14 may be implemented by or embodied in a computer. 3D compliance management unit 14 may include data functional blocks 30 coupled with control apparatus 12. Data functional blocks 30 may include a requirements data functional block $32_1$, a tasks data functional block $32_2$, an information data functional block $32_3$, a records data functional block $32_4$ and other data functional blocks $32_n$. The indicator "n" is employed to signify that there can be any number of data functional blocks in 3D compliance management unit 14. The inclusion of five data functional blocks $32_1$, $32_2$, $32_3$, $32_4$, $32_n$ in FIG. 1 is illustrative only and does not constitute any limitation regarding the number of data functional blocks that may be included in the 3D compliance management unit of the present disclosure. Throughout this description, use of a reference numeral using a generic subscript herein may be taken to mean that any respective member of the plurality of elements having the same reference numeral may be regarded as included in the description. Thus, by way of example and not by way of limitation, referring to data functional block $32_n$ in describing FIG. 1 may be taken to mean that any data functional block—$32_1$, $32_2$, $32_3$, $32_4$ or $32_n$ (FIG. 1)—may be regarded as capable of employment as described.

Requirements data functional block $32_1$ may operate to receive from control apparatus 12 requirements associated with a program to be implemented. Tasks data functional block $32_2$ may operate to receive from control apparatus 12 tasks associated with meeting the requirements received by requirements data functional block $32_1$. Information data functional block $33_3$ may operate to receive from control apparatus 12 information relating to data received by other data functional blocks $32_n$. Records data functional block $32_4$ may operate to receive from control apparatus 12 information relating to records required to support the program being implemented.

3D compliance management unit 14 may further include a display drive unit 34 coupled with control apparatus 12 via data functional blocks 30. Display drive unit 34 may be embodied in a 3D display drive functional block $36_1$ and a schedule display drive functional block $36_m$. The indicator "m" is employed to signify that there can be any number of display drive functional blocks in 3D compliance management unit 14. The inclusion of two display drive functional blocks $36_1$, $36_m$, in FIG. 1 is illustrative only and does not constitute any limitation regarding the number of display drive functional blocks that may be included in the 3D compliance management unit of the present disclosure.

3D display drive functional block $36_1$ may operate to drive a display unit (e.g., display unit 24) to present a three-dimensional graphic representation of information useful in effecting the program being implemented. Schedule display drive functional block $36_m$ may operate to drive a display unit (e.g., display unit 24) to present a graphic representation of time and schedule information useful in effecting the program being implemented. 3D display drive functional block $36_1$ and schedule display drive functional block $36_m$ may cooperate to present graphic representations on a common display unit (e.g., display unit 24).

3D compliance management unit 14 may further include a task schedule optimizer functional block 38 coupled with control apparatus 12 via data functional blocks 30. Task schedule optimizer functional block 38 may operate to efficiently carry out scheduled events associated with effecting the program being implemented.

3D compliance management unit 14 may further include a report out functional block 39 coupled with control apparatus 12 via data functional blocks 30. Report out functional block 39 may operate as a data reporting unit to present reports associated with effecting the program being implemented.

Display drive unit 34, task schedule optimizer functional block 38 and report out functional block 39 may be coupled with input unit 20 to provide information for display and reports for otherwise presenting to an operator (not shown in FIG. 1).

Figure 2:
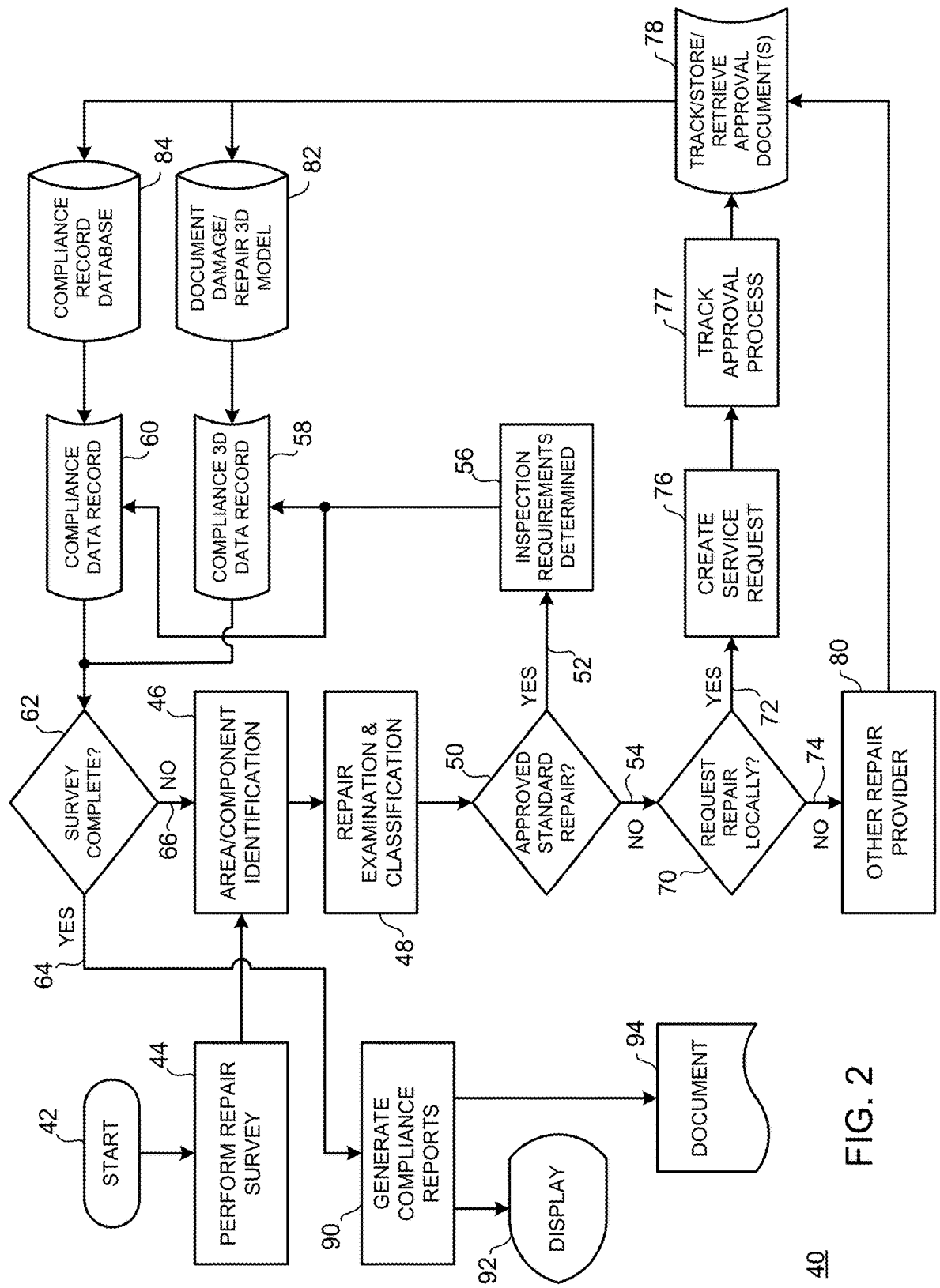
FIG. 2 illustrates an exemplary embodiment of the functional depiction illustrated in FIG. 1.

FIG. 2 illustrates an exemplary embodiment of the functional depiction illustrated in FIG. 1. In FIG. 2, a system 10 (FIG. 1) may be exercised in a representative treatment 40 beginning at a START locus 42. Treatment 40 may continue with identifying the action to follow as performing a repair survey, as indicated by a block 44. A capability to carry out a repair survey may enable tracking of documentation of complete repair and inspection history by individual aircraft. A capability to carry out a repair survey may also facilitate leased equipment and fleet equipment transfers. Based on individual aircraft records, age, survey area and model, treatment 40 may generate an identification and inspection record survey for a particular aircraft or a fleet of aircraft.

Treatment 40 may continue with identifying an area or component at which to perform a repair survey, as indicated by a block 46. This capability for identifying an area or component at which to perform a repair may permit input of damage and inspection analysis by volume, time, task and capacity. This capability for identifying an area or component at which to perform a repair may also permit association of a 3D position or locus on an aircraft with an FAA requirement for repair or inspection and locating all airworthiness directives and service bulletins by 3D location on the aircraft. This capability for identifying an area or component at which to perform a repair may also permit an airline to recognize the 3D proximity of tasks (e.g., repairs, alterations, inspections, cleaning, corrosion protection, removals or replacements and other tasks) and requirements within a user-defined (via input unit 20; FIG. 1) range of time to effect efficient performance of tasks situated within a proximity of each other in locus or in time. This capability for identifying an area or component at which to perform a repair may also provide a single source at which to view all requirements (e.g., FAA, Other Equipment Manufacturers (OEM), airline, third party providers and other generators of program requirements) indicated with appropriate 3D location within a selected time interval for tasks that may be user defined, for example (via input unit 20; FIG. 1).

Treatment 40 may continue with examining and classifying the repair found at the area or component identified pursuant to block 46, as indicated by a block 48. This capability for examining and classifying a repair may permit using electronic repair assessment guides to provide categorization guidance for all previous repairs. This capability for examining and classifying a repair may also permit matching repair re-use using similarity analysis of previous repair data, and may enable the re-use of damage tolerance data based on 3D location data with respect to an individual aircraft, model of aircraft or class of aircraft. This capability for examining and classifying a repair may also permit performing a search of previous repairs and matching capability based on location, size, material, type, model, or other analysis and may extract previous approved repairs in the repair database through inferred data analysis. This capability for examining and classifying a repair may also permit locating repairs by location and part number integration with previous approved repairs in a repair database.

Treatment 40 may continue by posing a query whether the repair was an approved standard repair (e.g., a repair approved by the FAA), as indicated by a query block 50. If the repair was an approved standard repair, treatment 40 may proceed from query block 50 via a YES response line 52 and inspection requirements for the repair may be determined, as indicated by a block 56. This capability for determining inspection requirements may permit integrating inspection task requirements with maintenance task card modification and planning. This capability for determining inspection requirements may permit scheduling, tracking and managing all maintenance actions required by various entities, including incorporating both repetitive and non-repetitive inspections. This capability for determining inspection requirements may permit grouping and scheduling of tasks managed by 3D volume location associated with specific maintenance zones of activities based on an individual airplane's availability for scheduled periods for performing maintenance.

Treatment 40 may continue with creating and storing a compliance 3D data record at a data store 58 and creating and storing a compliance data record at a data store 60.

If the repair was not an approved standard repair, treatment 40 may proceed from query block 50 via a NO response line 55 to pose a query whether the repair is a locally requested repair (e.g., requested by an airplane manufacturer), as indicated by a query block 70.

If the repair is a locally requested repair, treatment 40 may proceed from query block 70 via a YES response line 72 to create a service request, as indicated by a block 76. Treatment 40 may continue with tracking a predetermined approval process associated with a creation of a service request, as indicated by a block 77. Treatment 40 may continue with tracking, storing or retrieving approval documents associated with the service request as appropriate, as indicated by a block 78.

If the repair is not a locally requested repair, treatment 40 may proceed from query block 70 via a NO response line 74 to obtain information regarding the repair as originating from another repair provider (e.g., another FAA repair provider), as indicated by a block 80. Treatment 40 may continue with tracking, storing or retrieving approval documents associated with the service provided by another repair provider as appropriate, as indicated by a block 78.

Treatment 40 may proceed from block 78 with creating an entry to document damage or repair in a 3D model, as indicated by symbol 82, and may store a data record indicating that entry at data store 58. Treatment 40 may also proceed from block 78 to create an entry to document compliance with a repair requirement, as indicated by symbol 84 and may store a data record indicating that compliance at a data store 60.

Treatment 40 may proceed from data stores 58, 60 by providing records from data stores 58, 60 to pose a query whether the currently extant survey (identified in block 44) is complete, as indicated by a query block 62. If the currently extant survey is not complete, treatment 40 may proceed from query block 62 via a NO response line 66 and treatment 40 may proceed thereafter as described above in connection with blocks 46, 48, 50, 56, 58, 60, 70, 76, 77, 78, 80, 82, 84, 62.

If the currently extant survey is complete, treatment 40 may proceed from query block 62 via a YES response line 64 to generate compliance reports, as indicated by a block 90. This capability to generate reports may also include a capability to perform information analysis. This report generation and information analysis function may support the FAA compliance audit process by providing proof of all modification and repairs shown in 3D and retrieving all authorizations for modifications and repairs. The reports may also visualize and track inspections and replacement of temporary repairs. Such a capability may permit an airline to demonstrate that each airplane is compliant with all FAA data requirements. In addition, the report generation and information analysis function may manage transfer of a complete repair and inspection history of an airplane transfer of equipment documentation, thus enabling return to leaser and fleet equipment transfer through the generation of a transfer inspection report and mini-survey. The report generation and information analysis function may provide standard data exchange for structural repair records and inspections.

Compliance reports may be generated in any of several formats. By way of illustration and not by way of limitation, reports may be presented via a display, as indicated by a display symbol 92, and a document, as indicated by a document symbol 94.

Figure 3:
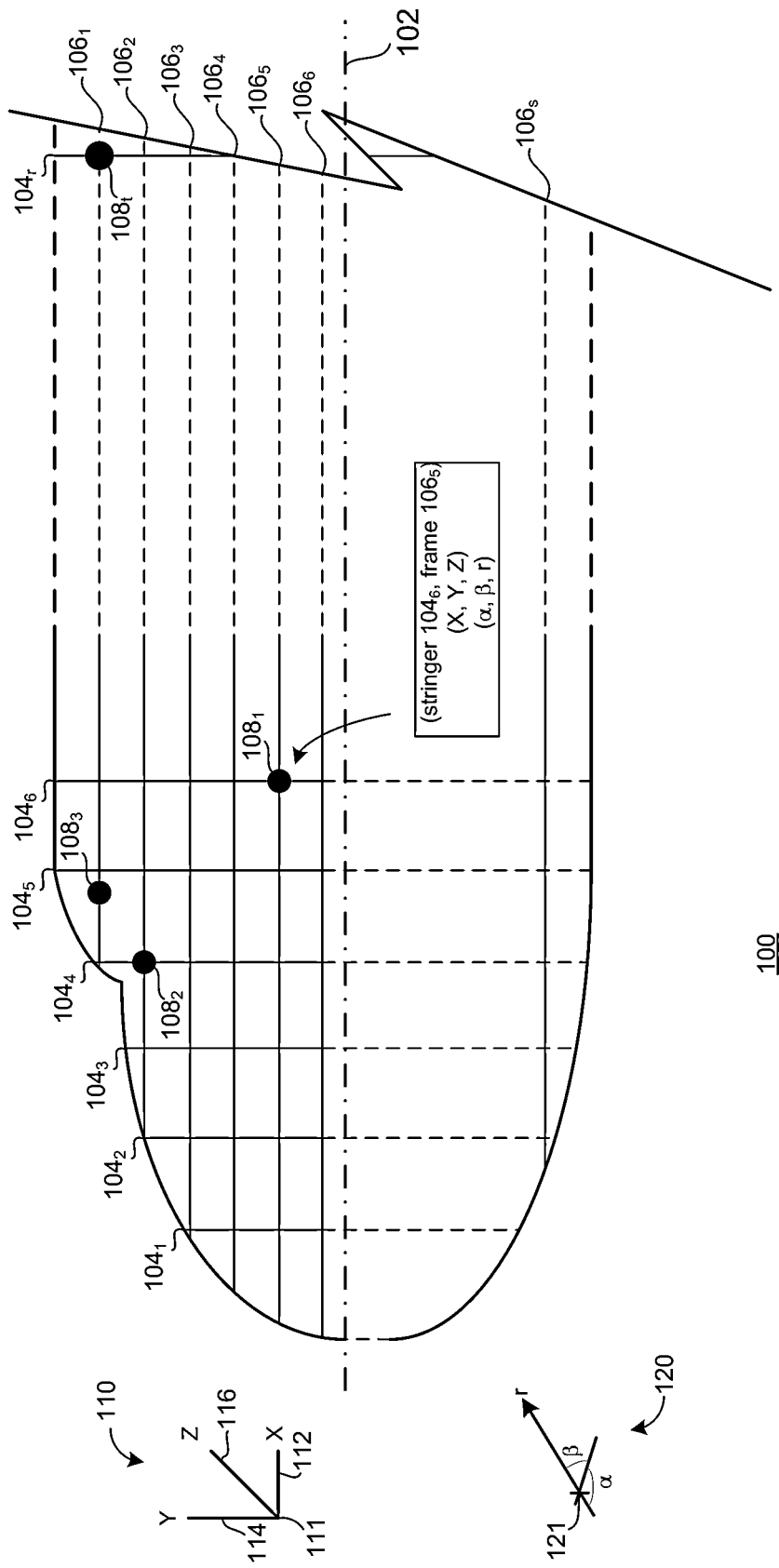
FIG. 3 illustrates a representative aircraft in connection with various location reference systems indicating example task-loci in the aircraft.

FIG. 3 illustrates a representative aircraft in connection with various location reference systems indicating exemplary task-loci in the aircraft. In FIG. 3, a schematic representation of an aircraft 100 is illustrated having stringers $104_1, 104_2, 104_3, 104_4, 104_5, 104_6, 104_r$ generally perpendicular with an axis 102. The indicator "r" is employed to signify that there can be any number of stringers in aircraft 100. The inclusion of seven stringers $104_1, 104_2, 104_3, 104_4, 104_5, 104_6, 104_r$ in FIG. 3 is illustrative only and does not constitute any limitation regarding the number of stringers that may be included in an aircraft employed with the present disclosure.

Aircraft 100 may also have frames $106_1, 106_2, 106_3, 106_4, 106_5, 106_6, 106_s$ generally parallel with axis 102. The indicator "s" is employed to signify that there can be any number of frames in aircraft 100. The inclusion of seven frames $106_1, 106_2, 106_3, 106_4, 106_5, 106_6, 106_s$ in FIG. 3 is illustrative only and does not constitute any limitation regarding the number of frames that may be included in an aircraft employed with the present disclosure.

Aircraft 100 is illustrated in FIG. 3 in two dimensions. However, one skilled in the art of airplane design may understand that stringers $104_r$ and frames $106_s$ may be arranged in three dimensions (3D) and it is in such a 3D context that this description of FIG. 3 is most pertinent.

Representative task-loci $108_1, 108_2, 108_3, 108_t$ are illustrated in FIG. 3. The indicator "t" is employed to signify that there can be any number of task-loci identified in aircraft 100. The inclusion of four task-loci $108_1, 108_2, 108_3, 108_t$ in FIG. 3 is illustrative only and does not constitute any limitation regarding the number of task-loci that may be identified in an aircraft employed with the present disclosure. Each respective task-locus $108_t$ is associated with a respective program task, such as a maintenance task. Locations of task-loci $108_t$ within or on aircraft 100 may be described or fixed according to any convenient reference system. By way of example and not by way of limitation, task-loci may be located according to stringer-frame relations. In such a locating arrangement, by way of example and not by way of limitation, task-locus $108_1$ may be described as being located at (stringer $104_6$, frame $106_5$).

By way of further example and not by way of limitation, a reference frame 110 may be established having an origin 111 and three axes: X-axis 112, Y-axis, 114 and Z-axis 116. Axes 112, 114, 116 are substantially orthogonal and intersect substantially at axis 111. Task-locus $108_1$ may be located substantially at a point defined by measurements along axes 112, 114, 116: $(X_1, Y_1, Z_1)$.

Alternatively, by way of further example and not by way of limitation, a reference frame 120 may be established having an origin 121 and three polar coordinates: an angle α measured in a first plane, an angle β measured in a second plane substantially perpendicular with the first plane and a radius R (distance from origin 121). Task $108_1$ may be located substantially at a point defined by coordinates (α, β, r).

Figure 4:
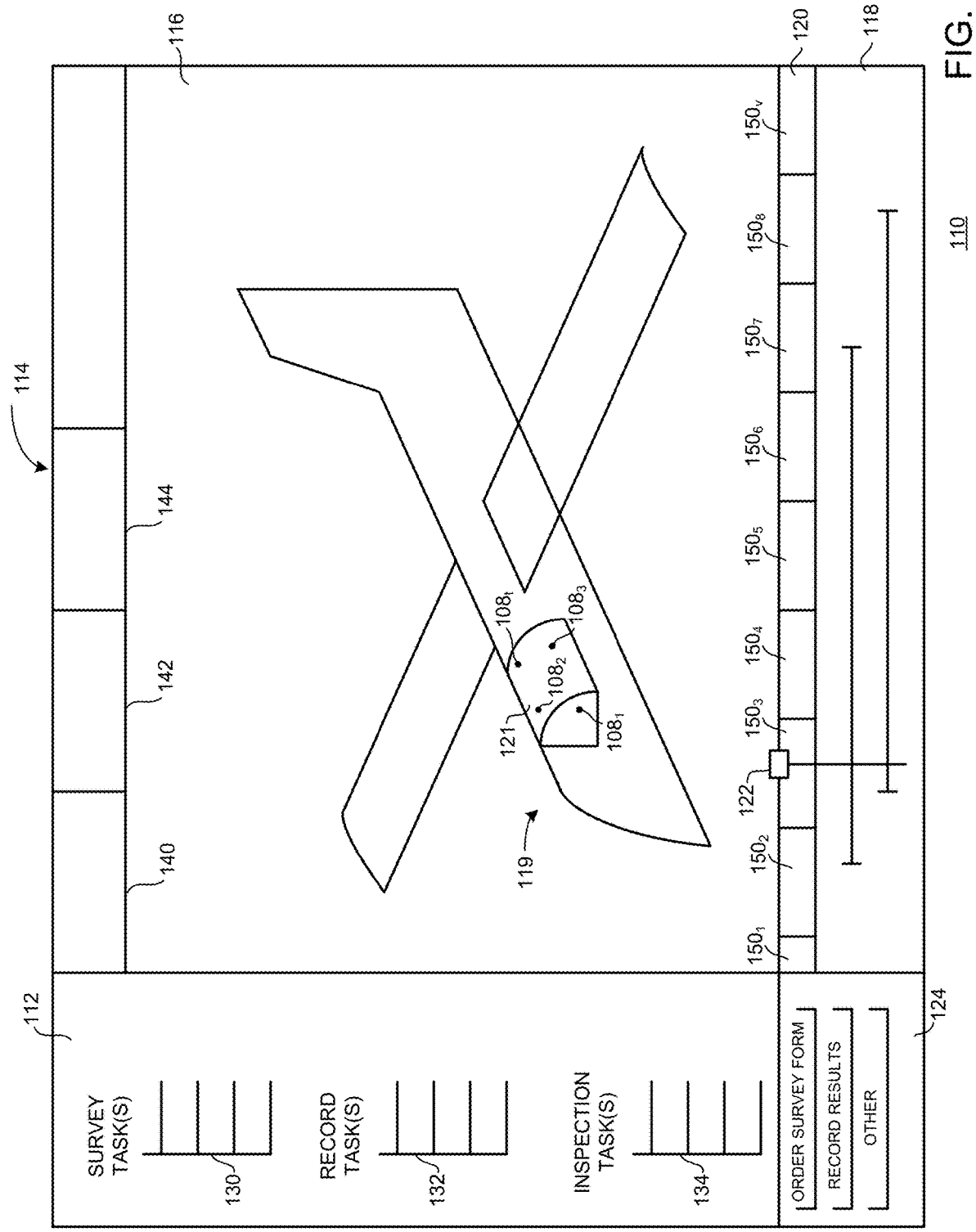
FIG. 4 illustrates an example display appropriate for use with the system shown in FIG. 1.

FIG. 4 illustrates an exemplary display appropriate for use with the present disclosure. In FIG. 4, a display window 110 may include a task window 112, a view selection window 114, a selected view window 116, a schedule window, a date indicator window 120, a time indicator 122 and an action window 124.

Task window 112 may permit a user to call up particular tasks associated with a program, such as a maintenance program. By way of example and not by way of limitation tasks may be identified as survey tasks, record tasks or inspection tasks. Survey tasks may be associated with determining status of completion of particular tasks, tasks to be completed within a particular time frame or another group of tasks. Survey tasks may be indicated or selected in a survey task section 130 of task window 112.

Record tasks may be associated with reporting requirements levied by various authorities such as, by way of example and not by way of limitation, the FAA. Record tasks may be indicated or selected in a record task section 132 of task window 112.

Inspection tasks may be associated with requirements to conduct inspections according to a periodic schedule or on an as occurring basis as may be set out by various authorities. Inspection tasks may be indicated or selected in an inspection tasks section 134 of task window 112.

View selection window 114 may permit a user to select a particular view of a particular section of a particular airplane or airplane-type. By way of example and not by way of limitation, a section 140 of view selection window 114 may permit selection of a particular airplane, a section 142 may permit selection of a particular body section 119 of the airplane selected in section 140 and a section 144 may permit selection of a particular zone 121 of the body section selected in section 142.

Selected view window 116 presents the particular view selected in view selection window 114.

Schedule window 118 indicates schedule requirements of a program as mapped onto the time frame indicated by date indicator window 120.

Date indicator window 120 may be divided into months, weeks, days, hours or another time interval arranged among segments $150_1$, $150_2$, $150_3$, $150_4$, $150_5$, $150_6$, $150_7$, $150_8$, $150_v$. The indicator "v" is employed to signify that there can be any number of segments in date indicator window 120. The inclusion of nine segments $150_1$, $150_2$, $150_3$, $150_4$, $150_5$, $150_6$, $150_7$, $150_8$, $150_v$ in FIG. 4 is illustrative only and does not constitute any limitation regarding the number of segments that may be included in a display window employed with the present disclosure.

Time indicator 122 may be oriented to indicate a subdivision of a segment $150_v$.

Action window 124 may provide input loci for a user to indicate certain actions such as, by way of example and not by way of limitation, ordering generation of a survey form, ordering recording of repair survey results for display in selected view window 116 or performing another task associated with a program.

Task-loci $108_1$, $108_2$, $108_3$, $108_t$ (see also FIG. 3) may be indicated in selected view window 116.

The system of the present disclosure may be configured to permit:

Integrated and comprehensive management of compliance with FAA aircraft maintenance requirements.

Allowing a user to perform maintenance research in a "3D fly-through" mode to see where each task and requirement is located on an airplane and the associated time-line requirements.

Allowing a user to author new tasks and requirements with a 3D locater linked with each task and requirement.

Providing a single source application to view all tasks and requirements originating from various authorities with their respective 3D locations within a user-defined time interval.

Allowing a user to document and show all maintenance, inspections, repairs and alterations performed with 3D links and within a user-defined time interval.

Allowing a user to easily recognize the 3D proximity of tasks (e.g., repairs, alterations, inspections, cleaning, corrosion protection, removals, replacements and other tasks) and requirements within a user defined time interval, for the purpose of efficiently and conveniently grouping and scheduling tasks during scheduled down-time when specific areas (zones) of an airplane will be "opened up" and most available for scheduled periods of time for maintenance.

Enabling physical and records audits of an airplane for all repairs and alterations by clearly showing an auditor the 3D location of each maintenance/repair/alteration record and also for audit of records during transfer of airplanes between airlines and lease companies.

3D cataloging and retrieval of modification data for an aircraft modification business.

Comprehensive 3D configuration management of the as-flying configuration of an aircraft: structure, repairs, alterations, systems and loadable software.

Figure 5:
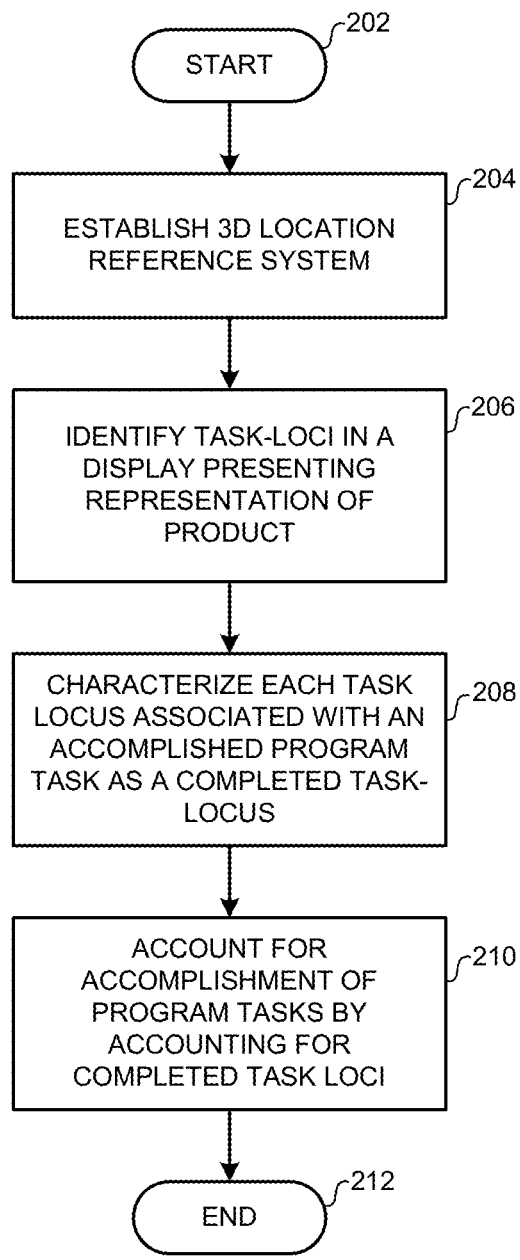
FIG. 5 is a flow chart illustrating an example method for managing a program relating to a product.

FIG. 5 is a flow chart illustrating an example method for managing a program relating to a product. In FIG. 5, a method 200 for managing a program relating to a product begins at a START locus 202. Method 200 may be implemented by or embodied in a computer. The program includes a plurality of program requirements for performing a plurality of program tasks.

Method 200 continues with establishing a location reference system for a representation of the product in three dimensions, as indicated by a block 204.

Method 200 continues with identifying a plurality of task-loci in a display, as indicated by a block 206. The display presents the representation of the product according to the location reference system. Each respective task-locus of the plurality of task-loci is associated with a respective program task of the plurality of program tasks.

Method 200 continues with characterizing each respective task-locus associated with an accomplished respective program task as a respective completed task-locus, as indicated by a block 208.

Method 200 continues with accounting for accomplishment of the respective program tasks by accounting for the respective completed task-loci, as indicated by a block 210. Method 200 terminates at an END locus 212.

It is to be understood that, while the detailed drawings and specific examples given describe preferred embodiments of the disclosure, they are for the purpose of illustration only, that the apparatus and method of the disclosure are not limited to the precise details and conditions disclosed and that various changes may be made therein without departing from the spirit of the disclosure.

Figure 6:
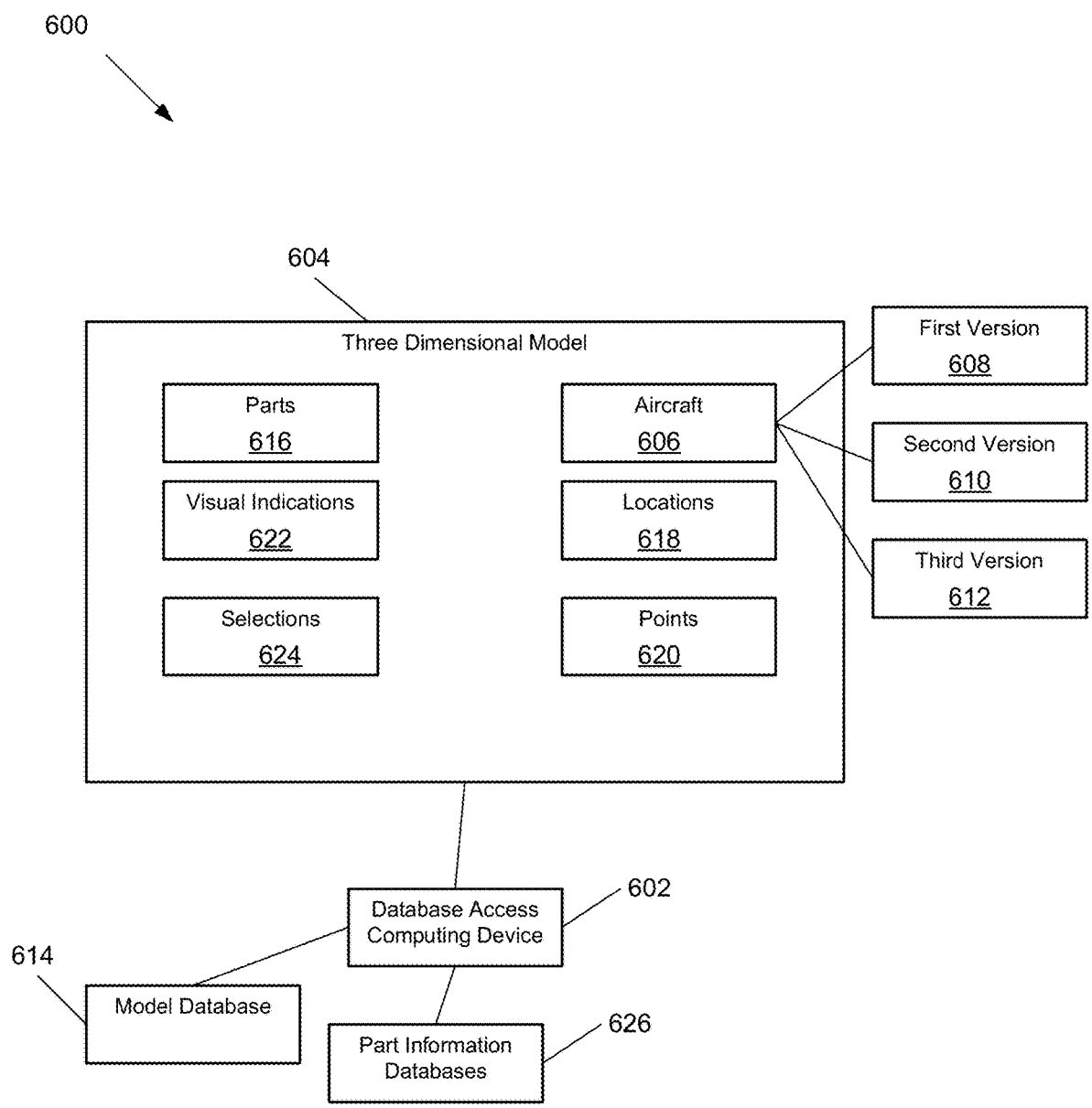
FIG. 6 is a block diagram of an environment in which a database access computing device displays a three dimensional model representing at least one aircraft.

FIG. 6 is a block diagram of an environment 600 in which a database access computing device 602 displays a three dimensional model 604 representing at least one aircraft 606. In some implementations, aircraft 606 is aircraft 100, described above. As described herein, in some implementations, three dimensional model 604 represents a single version of aircraft 606, for example first version 608. In other implementations, three dimensional model 604 represents a plurality of versions of aircraft 606, for example, first version 608, a second version 610, and a third version 612. In other implementations, three dimensional model 604 is associated with any number of versions (i.e., 1 through N versions) of aircraft 606. Database access computing device 602 retrieves model data from model database 614 to display three dimensional model 604. Three dimensional model 604 includes a plurality of parts 616, such as aircraft parts, at locations 618 associated with one or more points 620 in space. In implementations in which three dimensional model 604 represents multiple versions (e.g., first version 608, second version 610, and third version 612, or any other number of versions) of aircraft 606, three dimensional model 604 is a composite model (e.g., an overlay) of each version of aircraft 606 and database access computing device 602 displays one or more visual indications 622 of any parts 616 that differ from one version (e.g., first version 608) of aircraft 606 to another version (e.g., second version 610) of aircraft 606. In some implementations, database access computing device 602 displays a different version of aircraft 606 in each of a plurality of separate windows or insets. In some implementations, visual indications 622 include one or more outlines, colors, or other indicia that visually distinguish the parts 616 from other components of three dimensional model 604.

Database access computing device 602 receives selections 624 of one or more locations 618 from a user interacting with database access computing device 602, for example through an input device, and retrieves part information pertaining to one or more parts 616 associated with the one or more selected locations 618 from one or more part information databases 626. In at least some implementations, part information databases 626 do not index or otherwise associate part information 814 with locations 618 or points 620 of a three dimensional model (e.g., three dimensional model 604). Rather, part information databases 626 associate part information with other identifiers, for example part numbers 812. Accordingly, and as described in more detail herein, database access computing device 602 retrieves a part number 812 associated with each selected location 618, from model database 614. After retrieving the part numbers 812, database access computing device 602 retrieves part information from part information databases 626 using the part numbers 812 as keys or search terms. Database access computing device 602 then displays at least a portion of the retrieved part information.

Figure 7:
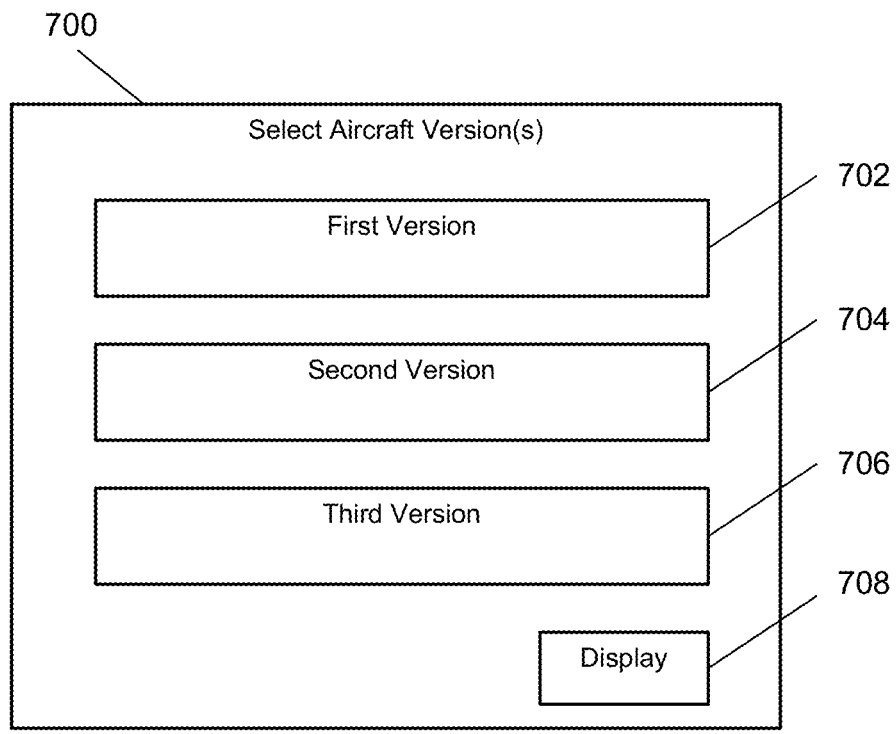
FIG. 7 is an example user interface displayed by the database access computing device for selecting one or more versions of an aircraft to be represented.

FIG. 7 is an example user interface 700 displayed by database access computing device 602 for enabling a user to select one or more versions (e.g., first version 608, second version 610, and/or third version 612) of an aircraft (e.g., aircraft 606) to be represented by three dimensional model 604. User interface 700 includes a first selector 702 that, if selected by a user, designates first version 608 for representation by three dimensional model 604. Likewise, user interface 700 includes a second selector 704 that, if selected by the user, designates second version 610 for representation by three dimensional model 604. Additionally, user interface 700 includes a third selector 706 that, if selected by the user, designates third version 612 for representation by three dimensional model 604. Additionally, user interface 700 includes a display button 708 that, if selected by the user, causes database access computing device 602 to display three dimensional model 604, representing each of the designated versions (e.g., one or more of first version 608, second version 610, and third version 612), as described above. As described above, in some implementations, three dimensional model 604 is associated with any number of versions (i.e., 1 through N versions) of aircraft 606.

Figure 8:
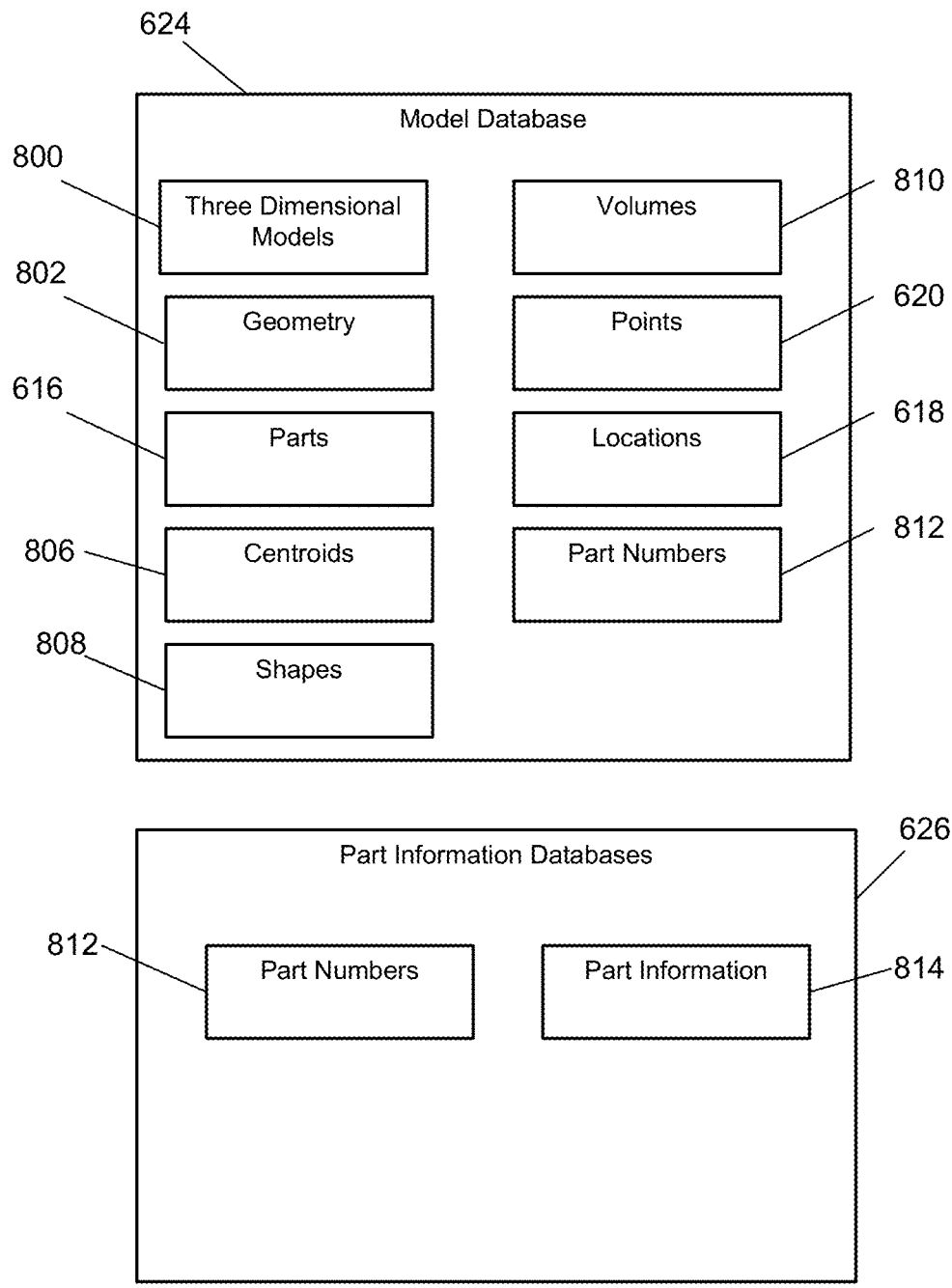
FIG. 8 is a diagram of data stored in databases that are accessed by the database access computing device.

FIG. 8 is a diagram of data stored in model database 614 and part information databases 626. Model database 614 includes three dimensional models 800, including three dimensional model 604. For example, in some implementations, model database 614 includes a three dimensional model 800 of each version (e.g., first version 608, second version 610, and third version 612) of aircraft 606. In some implementations, three dimensional models 800 include one or more models that are representative of a plurality of different versions of aircraft 606. Additionally, for example for each three dimensional model 800, model database 614 includes geometry information 802. Geometry information 802 includes points 620, locations 618 representing one or more of the points 620, and centroids 806, shapes 808, and volumes 810 associated with one or more parts 616 that are associated with the locations 618. In addition, model database 614 includes one or more part numbers 812 associated with corresponding parts 616. Part information databases 626 include part numbers 812 and part information 814 stored in association with part numbers 812. In particular, in at least some implementations, part information databases 626 index part information 814, or otherwise make part information 814 searchable, based on part numbers 812.

Figure 9:
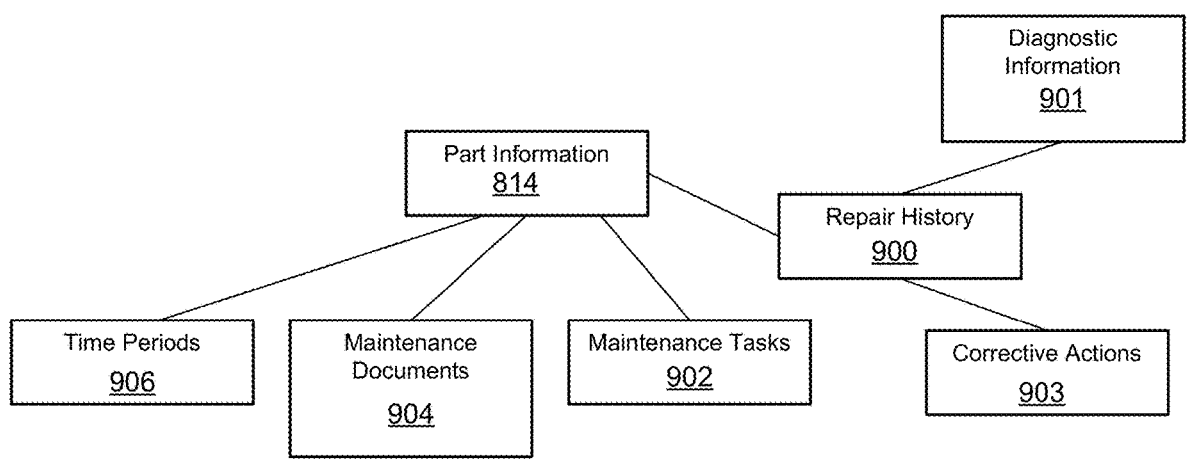
FIG. 9 is a diagram of part information stored in one or more of the databases accessed by database access computing device.

FIG. 9 is a diagram of part information 814 stored in part information databases 626. More specifically, part information 814 includes a repair history 900, for example diagnostic information 901, such as descriptions of errors associated with a part 616, and corrective actions 903, such as replacements or adjustments to the part 616. Additionally, part information 814 includes maintenance tasks 902 performed or scheduled to be performed on the part 616, maintenance documents 904 associated with the part 616, and one or more time periods 906. For example, each corrective action 903 is associated with a time period 906 in which the corrective action 903 took place. Likewise, each maintenance task 902 is associated with a time period 906 in which the maintenance task 902 took place or is scheduled to take place.

Figure 10:
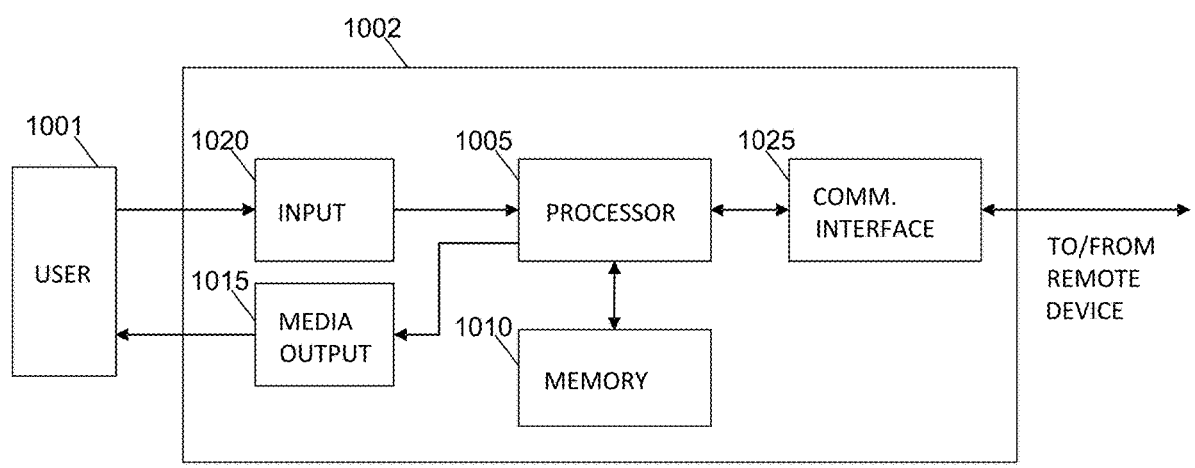
FIG. 10 is a diagram of an example computing device used in the environment of FIG. 6.

FIG. 10 is a diagram of an example computing device 1002. Computing device 1002 is representative of portable device database access computing device 602. More specifically, database access computing device 1002 includes one or more components of computing device 1002. Computing device 1002 includes at least one processor 1005 for executing instructions. In some implementations, executable instructions are stored in a memory device 1010. Processor 1005 may include one or more processing units (e.g., in a multi-core configuration). One or more memory devices 1010 are any one or more devices allowing information such as executable instructions and/or other data to be stored and retrieved. One or more memory devices 1010 may include one or more computer-readable media.

Computing device 1002 also includes at least one media output component 1015 for presenting information to a user 1001. Media output component 1015 is any component capable of conveying information to user 1001. In some implementations, media output component 1015 includes an output adapter such as a video adapter and/or an audio adapter. An output adapter is operatively coupled to processor 1005 and operatively couplable to an output device such as a display device (e.g., a liquid crystal display (LCD), organic light emitting diode (OLED) display, cathode ray tube (CRT), or "electronic ink" display) or an audio output device (e.g., a speaker or headphones). In at least some implementations, media output component 1015 causes three dimensional models (e.g., three dimensional model 604) and user interfaces (e.g., user interface 700) to be displayed to user 1001.

In some implementations, computing device 1002 includes an input device 1020 for receiving input from user 1001. Input device 1020 may include, for example, a keyboard, a pointing device, a mouse, a stylus, a touch sensitive panel (e.g., a touch pad or a touch screen), a gyroscope, an accelerometer, a position detector, or an audio input device.

A single component such as a touch screen may function as both an output device of media output component 1015 and input device 1020.

Computing device 1002 additionally includes a communication interface 1025, which is communicatively couplable to a remote device such as another computing device 1002. Communication interface 1025 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Stored in one or more memory devices 1010 are, for example, computer-readable instructions for providing a user interface to user 1001 via media output component 1015 and, optionally, receiving and processing input from input device 1020. A user interface may include, text, graphics, and/or sound that enable user 1001 to interact with computing device 1002.

Figure 11:
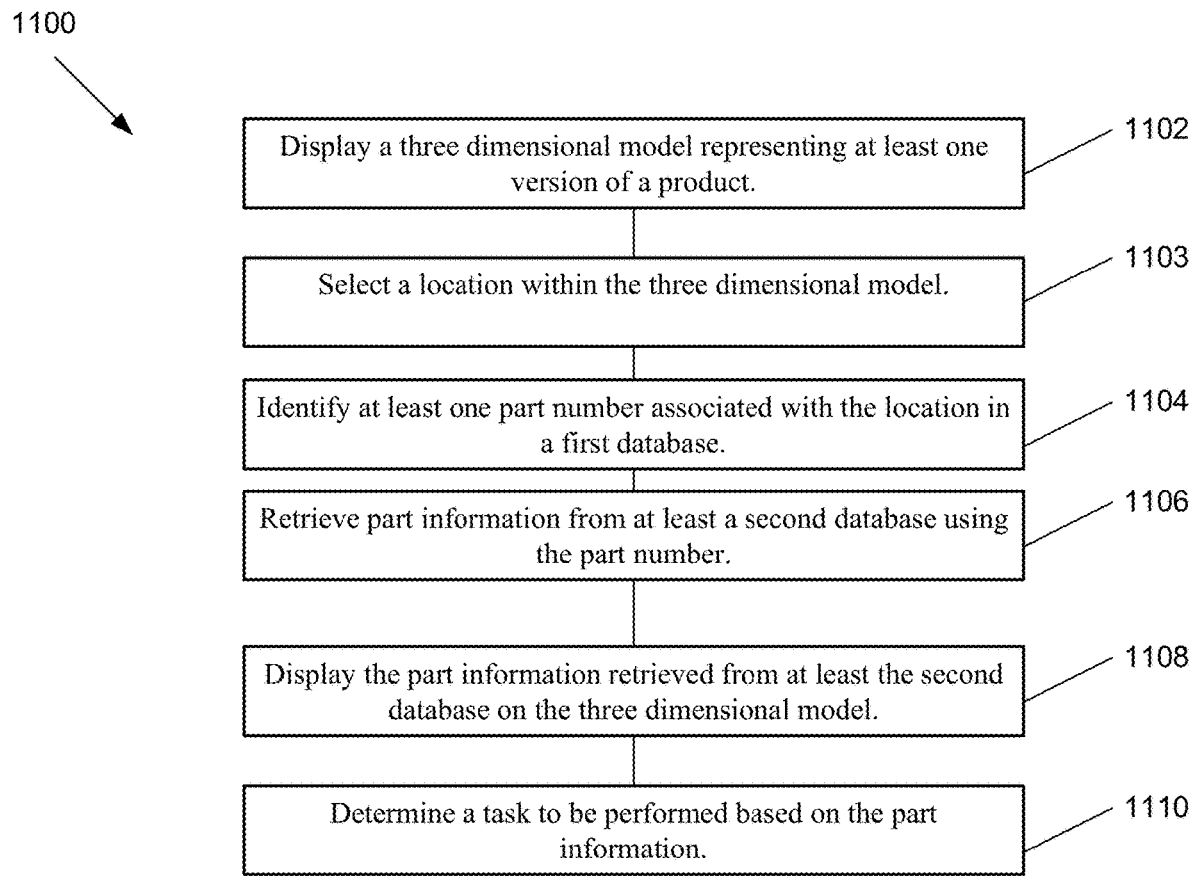
FIG. 11 is a diagram of an example process for utilizing a three dimensional model to access databases.

FIG. 11 is a diagram of a process 1100 performed by database access computing device 602 for utilizing a three dimensional model (e.g., three dimensional model 604) to access databases (e.g., model database 614 and part information databases 626). Database access computing device 602 displays 1102 a three dimensional model (e.g., three dimensional model 604) representing at least one version (e.g., first version 608) of a product (e.g., aircraft 606). Additionally, database access computing device 602 selects 1103, or receives a selection of (e.g., selection 624) at least one location (e.g., location 618) within the three dimensional model (e.g., three dimensional model 604). Additionally, database access computing device 602 identifies 1104 at least one part number (e.g., part number 812) associated with the location (e.g., location 618) in a first database (e.g., model database 614). Additionally, database access computing device 602 retrieves 1106 part information 814 from at least a second database (e.g., one of part information databases 626) using the part number (e.g., part number 812). Additionally, database access computing device 602 displays 1108 the part information (e.g., part information 814) retrieved from at least the second database (e.g., one of part information databases 626) on the three dimensional model 604. Additionally, database access computing device 602 determines 1110 a task to be performed based on the part information.

In at least some implementations, database access computing device 602 is additionally configured to receive a selection (e.g., selection 624) of at least two versions (e.g., first version 608 and second version 610) of the aircraft (e.g., aircraft 606) and display a three dimensional composite model (e.g., three dimensional model 604) representing the at least two versions (e.g., first version 608 and second version 610) of the aircraft (e.g., aircraft 606). In some implementations, database access computing device 602 is further configured to receive a selection (e.g., selection 624) that defines a plurality of points (e.g., points 620) within the three dimensional model (e.g., three dimensional model 604) and identify a plurality of part numbers (e.g., part numbers 812) associated with the plurality of points (e.g., points 620).

In some implementations, part information 814 is first part information and database access computing device 602 additionally receives user input including second part information 814 in association with the selected location 618. Additionally, database access computing device 602 stores the second part information 814 in at least the second database (e.g., one of part information databases 626) in association with the at least one part number 812. In some implementations, database access computing device 602 additionally stores the second part information 814 in association with a single version of the aircraft (e.g., first version 608). In some implementations, database access computing device 602 stores the second part information 814 in association with a plurality of versions (e.g., first version 608, second version 610, and third version 612) of the aircraft (e.g., aircraft 606).

In some implementations, database access computing device 602 additionally receives a selection 624 of a time interval (e.g., one of time periods 906) and retrieves the part information 814 by retrieving part information 814 associated with one or more repairs, maintenance events, and/or documentation of a repair or maintenance event associated with (e.g., that occurred at) one or more instances in time within the selected time interval (e.g., one of time periods 906). In some implementations, database access computing device 602 retrieves the part information 814 including at least one of a repair history 900, a maintenance task 902, and a maintenance document 904.

In some implementations, database access computing device 602 additionally displays a three dimensional composite model 604 representing at least two versions (e.g., first version 608 and second version 610) of the aircraft 606 and visually indicates (e.g., visual indication 622) that at least one aircraft part 616 represented in the three dimensional composite model 604 differs between the at least two versions (e.g., first version 608 and second version 610) of the aircraft 606.

A technical effect of systems and methods described herein includes at least one of: (a) displaying a three dimensional model representing at least one version of an aircraft; (b) receiving a selection of a location within the three dimensional model; (c) identifying at least one part number associated with the location in a first database; (d) retrieving part information from at least a second database using the part number; and (e) displaying the part information retrieved from at least the second database on the three dimensional model.

As compared to known methods and systems for accessing information about parts of a vehicle such as an aircraft, the methods and systems described herein enable the use of a three dimensional model that represents one or more versions of an aircraft to retrieve and store data about aircraft parts in databases that otherwise are not associated with the three dimensional model. Accordingly, users are able to easily access and store data associated with parts of the aircraft through a central interface that provides a visual, three dimensional representation of the aircraft, rather than attempting to retrieve and store data using text based interactions with one or more databases.

The description of the different advantageous implementations has been presented for purposes of illustration and description, and is not intended to be exhaustive or limited to the implementations in the form disclosed. Many modifications and variations will be apparent to those of ordinary skill in the art. Further, different advantageous implementations may provide different advantages as compared to other advantageous implementations. The implementation or implementations selected are chosen and described in order to best explain the principles of the implementations, the practical application, and to enable others of ordinary skill in the art to understand the disclosure for various implementations with various modifications as are suited to the particular use contemplated. This written description uses examples to disclose various implementations, which include the best mode, to enable any person skilled in the art to practice those implementations, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A database access computing device for utilizing a three dimensional model to access databases for information regarding one or more parts in a vehicle, said database access computing device comprising at least one processor, said database access computing device configured to:
   receive a selection of at least two versions of the vehicle;
   display, using a three dimensional display drive, a three dimensional model representing the at least two versions of the vehicle together;
   receive a selection of a location within the three dimensional model;
   identify at least one part number associated with the location in a first database;
   retrieve part information from at least a second database using the part number; and
   display the part information retrieved from at least the second database on the three dimensional model.

2. The database access computing device of claim 1, further configured to:
   receive a selection that defines a plurality of points within the three dimensional model; and
   identify a plurality of part numbers associated with the plurality of points.

3. The database access computing device of claim 1, wherein the part information is first part information, said database access computing device further configured to:
   receive user input including second part information m association with the selected location;
   store the second part information in at least the second database in association with the at least one part number; and
   display the first and second part information on the three dimensional model.

4. The database access computing device of claim 3, wherein the vehicle is an aircraft, said database access computing device is further configured to store the second part information in association with one or more versions of the aircraft.

5. The database access computing device of claim 1, further configured to:
   receive a selection of a time interval; and
   retrieve the part information by retrieving part information associated with one or more repairs, maintenance events, or documentation of a repair or maintenance event associated with one or more instances in time within the selected time interval.

6. The database access computing device of claim 1, further configured to retrieve the part information including at least one of a repair history, a maintenance task, and a maintenance document.

7. A method for displaying information regarding one or more parts in an aircraft, said method comprising:
   receiving a selection of at least two versions of the aircraft;
   displaying, by a database access computing device, a three dimensional model representing the at least two versions of the aircraft;
   selecting a location within the three dimensional model;
   identifying, by the database access computing device, at least one part number associated with the location in a first database;
   retrieving, by the database access computing device, part information from at least a second database using the part number;
   displaying, by the database access computing device, the part information retrieved from at least the second database on the three dimensional model; and
   determining a task to be performed based on the part information.

8. The method of claim 7, wherein identifying at least one part number further comprises identifying a plurality of part numbers associated with a plurality of selected points.

9. The method of claim 7, wherein the part information is first part information, said method further comprising:
   receiving user input including second part information in association with the selected location; and
   storing the second part information in at least the second database in association with the at least one part number.

10. The method of claim 9, further comprising storing the second part information in association with one or more versions of the aircraft.

11. The method of claim 7, further comprising:
    receiving a selection of a time interval; and
    retrieving the part information by retrieving part information associated with one or more repairs, maintenance events, or documentation of a repair or maintenance event associated with one or more instances in time within the selected time interval.

12. The method of claim 7, wherein retrieving the part information further comprises retrieving at least one of a repair history, a maintenance task, and a maintenance document.

13. The method of claim 7, wherein displaying the three dimensional model further comprises
    visually indicating that at least one aircraft part represented in the three dimensional composite model differs between the at least two versions of the aircraft.

14. A non-transitory computer-readable storage device having computer-executable instructions embodied thereon, wherein when executed by a computing device including at least one processor, said computer-executable instructions cause the computing device to:
    receive a selection of at least two versions of an aircraft;
    display a three dimensional model representing the at least two versions of the aircraft together;
    receive a selection of a location within the three dimensional model;
    identify at least one part number associated with the location in a first database;
    retrieve part information from at least a second database using the part number; and
    display the part information retrieved from at least the second database on the three dimensional model.

15. The non-transitory computer-readable storage device of claim 14, wherein said computer-executable instructions additionally cause the computing device to:
    receive a selection that defines a plurality of points within the three dimensional model; and
    identify a plurality of part numbers associated with the plurality of points.

16. The non-transitory computer-readable storage device of claim 14, wherein the part information is first part information, and said computer-executable instructions additionally cause the computing device to:
- receive user input including second part information in association with the selected location;
- store the second part information in at least the second database in association with the at least one part number; and
- display the first and second part information on the three dimensional model.

17. The non-transitory computer-readable storage device of claim 14, wherein said computer-executable instructions additionally cause the computing device to:
- receive a selection of a time interval; and
- retrieve the part information by retrieving part information associated with one or more repairs, maintenance events, or documentation of a repair or maintenance event associated with one or more instances in time within the selected time interval.

\* \* \* \* \*